(12) United States Patent
Schilz et al.

(10) Patent No.: US 7,211,355 B2
(45) Date of Patent: May 1, 2007

(54) METHOD FOR PRODUCING PHASE SHIFTER MASKS

(75) Inventors: Christof Matthias Schilz, München (DE); Klaus Eisner, Ottobrunn (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/252,476

(22) Filed: Oct. 18, 2005

(65) Prior Publication Data

US 2006/0037939 A1 Feb. 23, 2006

Related U.S. Application Data

(62) Division of application No. 10/614,429, filed on Jul. 7, 2003, now abandoned.

(30) Foreign Application Priority Data

Jul. 4, 2002 (DE) .................. 102 30 675

(51) Int. Cl.
 G03F 1/00 (2006.01)
 G03F 7/16 (2006.01)
 G03F 7/20 (2006.01)
(52) U.S. Cl. ......................... 430/5; 430/296
(58) Field of Classification Search ............ 430/5
 See application file for complete search history.

(56) References Cited

U.S. PATENT DOCUMENTS

| 4,197,332 A | 4/1980 | Broers et al. ............ 430/272.1 |
| 4,550,257 A | 10/1985 | Binnig et al. ............ 250/492.2 |
| 4,698,236 A | 10/1987 | Kellogg et al. ............ 427/526 |
| 5,147,823 A | 9/1992 | Ishibashi et al. ............ 438/694 |
| 5,429,730 A | 7/1995 | Nakamura et al. ..... 204/192.34 |
| 5,477,058 A * | 12/1995 | Sato ............................ 250/548 |
| 6,387,602 B1 * | 5/2002 | Hayden et al. ............. 430/327 |
| 6,836,371 B2 * | 12/2004 | Lai et al. ..................... 359/642 |
| 2003/0047691 A1 | 3/2003 | Musil et al. ............. 250/492.2 |

FOREIGN PATENT DOCUMENTS

| EP | 0 168 510 A1 | 1/1986 |
| EP | 0 304 969 A2 | 3/1989 |
| JP | 53 135 276 | 11/1978 |
| JP | 61 025 146 | 2/1986 |
| WO | 03/012551 A1 | 2/2003 |

OTHER PUBLICATIONS

Budavari, Susan, Editor, et al., The Merck Index, An Encyclopedia of Chemicals, Drugs, and Biologicals, 1989, Merck & Co., Inc., 11th Edition (Centennial Edition), pp. 1346-1347 (8442. Silicones).*

I. Utke, et al.: "Microelectronic Engineering 53 (2000)", pp. 261-264.

* cited by examiner

*Primary Examiner*—S. Rosasco
*Assistant Examiner*—John Ruggles
(74) *Attorney, Agent, or Firm*—Laurence A. Greenberg; Werner H. Stemer; Ralph E. Locher

(57) ABSTRACT

The invention relates to a method for producing phase shifter masks for 157 nm lithography. A coating has an organic material and is at least partially configured on the phase shifter mask. This coating is processed with an electron beam. This allows efficient production of very small structures, even for 157 nm lithography.

5 Claims, 2 Drawing Sheets

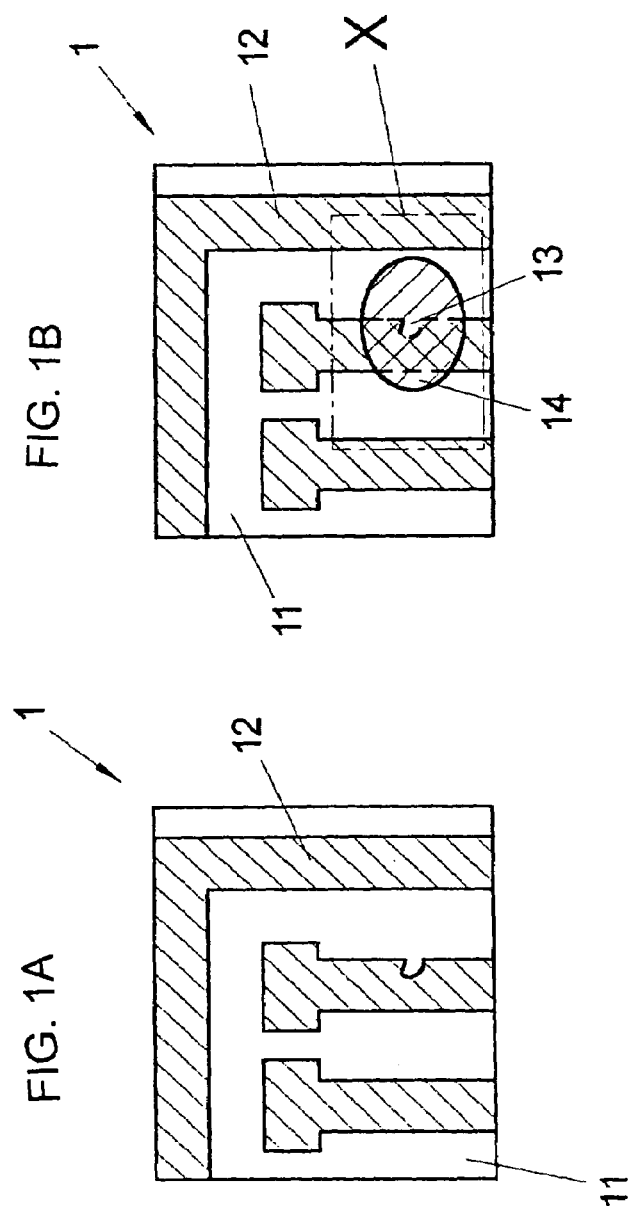
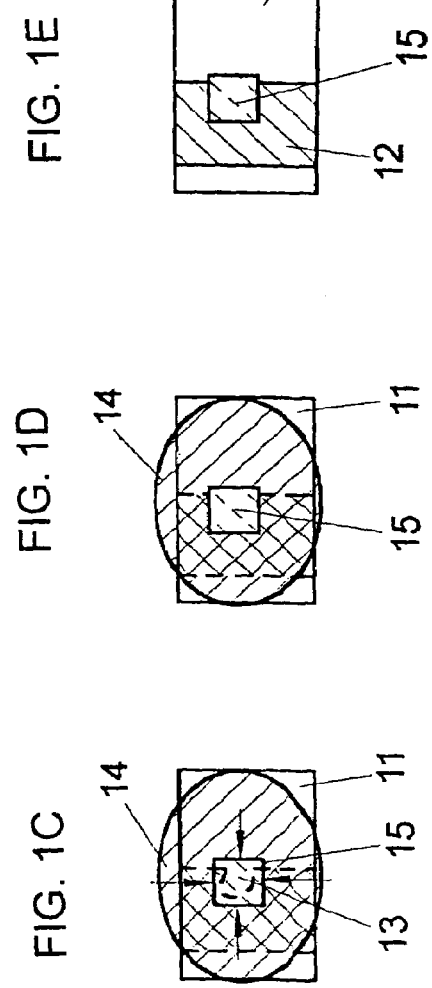

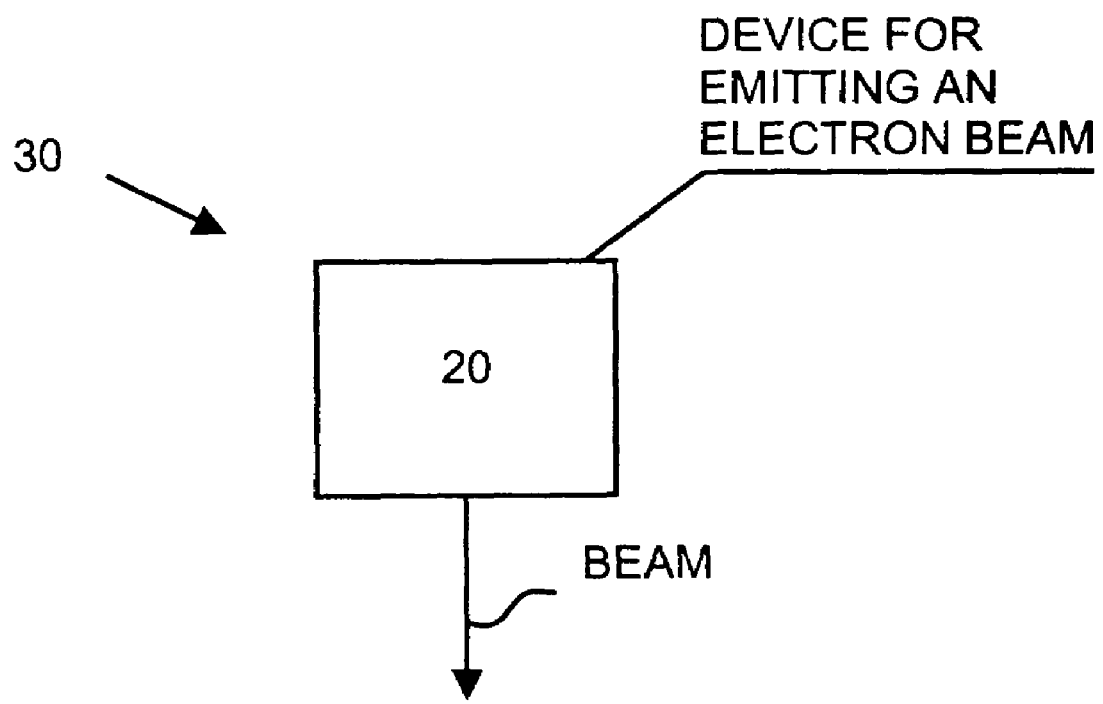

METHOD FOR PRODUCING PHASE SHIFTER MASKS

CROSS-REFERENCE TO RELATED APPLICATIONS

This is a divisional application of application Ser. No. 10/614,429, filed Jul. 7, 2003, now abandoned which claims the priority, under 35 U.S.C. §119, of German patent application No. 102 30 675.3, filed Jul. 4, 2002. The prior applications are herewith incorporated in their entirety.

BACKGROUND OF THE INVENTION

Field of the Invention

The invention relates to a method for producing phase shifter masks.

Structures that are applied to a substrate using lithography, for example, for DRAM (Dynamic Random Access Memory) production, are becoming increasingly smaller in order to achieve a high degree of miniaturization. One technologically limiting factor in this case is the wavelength of the light that is used for lithography. Particularly small structures can be produced using phase shifter masks (phase shift masks), which are known per se, such as half-tone phase shifter masks or strong, alternating phase shifter masks. In this case, in addition to the chromium that is normally used for masks, material is deliberately applied to the substrate to produce a phase shift of up to 180° in the light that is used for lithography. The extent of the phase shift depends on the application. Very fine structures can then be produced by destructive interference.

During the production of phase shifter masks, it is important for them to be as free of defects as possible, since defects will be transferred to all of the components produced using the mask. Defects are, for example, holes in absorber layers or locally thinned phase shifter materials.

With 193 nm lithography, it is known that defects can be repaired by the deposition (induced by ion beams) of thin polymer layers from the gas phase. A gallium-ion beam from a FIB (focused ion beam) device is passed through an organic gas for this purpose. The ion beam and the parameters of the gas can be varied in order to deposit thin polymer layers locally on the substrate. The polymer layers are formed from the gas phase, and cover bright field defects (for example due to lack of half-tone material).

The next generation of lithography will use light at a wavelength of 157 nm. In this case, it has been found that the polymer layers which are deposited by ion beams under the influence of the 157 nm radiation change their thickness in an uncontrolled manner, and, in particular, shrinkage can occur. This is disadvantageous since the shrinkage increases the optical transmission at the repaired point. The use of gallium ions for the deposition results in optical irreversible damage by direct implantation of gallium ions into the glass material of the phase shifter mask.

SUMMARY OF THE INVENTION

It is accordingly an object of the invention to provide an apparatus for producing a phase shifter mask for 157 nm lithography and a method for producing a phase shifter mask used for 157 nm lithography, which overcome the above-mentioned disadvantages of the prior art apparatus and methods of this general type.

With the foregoing and other objects in view there is provided, in accordance with the invention, a method for producing a phase shifter mask used for 157 nm lithography. The method includes a step of, producing and/or processing a coating of an organic material on the phase shifter mask using an electron beam.

The coating, which is and/or can be at least partially arranged on the phase shifter mask and is composed of an organic material, is processed and/or produced with an electron beam.

In this case, it is advantageous to:

configure the phase shifter mask in a space with at least one gaseous organic compound;

deposit at least one coating of the organic compound from the gas phase;

at least partially point at least one electron beam at the coating of the organic compound; and to decompose the coating by the electron beam, so that diffusion of organic compounds starts from non-irradiated areas of the coating.

In this case, it is particularly advantageous for the coating to be subsequently hardened by an electron beam.

In one advantageous refinement of the method, the coating is applied deliberately for repairing defects in a half-tone layer of the phase shifter mask.

In this case, it is also advantageous for UV cleaning of the phase shifter mask to be carried out after the coating with the decomposition product.

With the foregoing and other objects in view there is provided, in accordance with the invention, an apparatus for producing a phase shifter mask for 157 nm lithography. The apparatus includes a device for emitting at least one electron beam for producing a coating on the phase shifter mask and/or for processing a coating that has at least partially been configured on the phase shifter mask.

Disadvantages, for example, in the ion beam deposition, are avoided by a device for emitting at least one electron beam for processing and/or producing a coating which is at least partially configured on the phase shifter mask.

In this case, it is advantageous for the device for emitting at least one electron beam to be designed to deposit at least one organic coating on a phase shifter mask.

It is particularly advantageous for the device for emitting at least one electron beam to be controllable on a row and/or column basis, in particular for subsequent hardening.

Other features which are considered as characteristic for the invention are set forth in the appended claims.

Although the invention is illustrated and described herein as embodied in a method and apparatus for producing phase shifter masks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A to 1E are schematic illustrations of individual steps for one embodiment of the method; and FIG. 2 is a block diagram of a device for emitting an electron beam.

DESCRIPTION OF THE PREFERRED EMBODIMENTS

Referring now to the figures of the drawing in detail and first, particularly, to FIGS. 1A to 1E thereof, there is shown the individual steps of one embodiment of the method. These steps are based on a phase shifter mask 1. The phase shifter mask has, in a known manner, a quartz glass substrate 11, which in this case is illustrated in white, and an absorber material 12, which in this case is illustrated in shaded form, and which is used for deliberate phase shifting. During the process of producing the phase shifter material 12 on the substrate 11, it is assumed that a defect 13 has been found here in the phase shifter material 12.

In the step illustrated in FIG. 1B, a coating 14 of an organic material is deposited from the gas phase, and covers the defect 13.

In principle, any organic compound, which has a high adsorption coefficient, may be used as the organic material so that good adhesion is achieved between the coating and the substrate 11. However, the organic compound should be free of silicon-organic compounds and should have a high proportion of carbon, for example, aromatic compounds. Examples of suitable compounds are styrene and PHOST.

The organic compounds should be removed by UV radiation in a slightly acidic atmosphere, so that aromatics containing halogens are separated as possible organic compounds.

The deposition of the organic material as a coating 14 in this case takes place by using an electron beam. Alternatively, this coating can also be deposited by a different method.

FIG. 1C shows a detail X (see FIG. 1B). The defect is covered over a relatively large area by the coating 14 of organic material. Now, according to the invention, an electron beam (which is not shown here) is pointed at the immediate region around the defect 13. This region is represented by the field 15 in FIG. 1C. The electron beam scans this field in rows and/or columns, which leads to hardening of the organic material. The concentration gradient that is produced in the coating 14 results in the diffusion of organic molecules which are not yet reacted in the field 15 (surface diffusion), thus resulting in reinforcement of the hardening. The diffusion of the molecules is illustrated by arrows in FIG. 1C. The field 15 is illustrated in the hardened state in FIG. 1D.

The wide-area coating and the subsequent diffusion means that there is no need to pass gases with extreme accuracy to the location to be repaired.

A certain residual amount of gas, which is dependent on the partial pressure, is located above the substrate. Individual molecules are precipitated from this residual amount at those locations at which adsorption spaces have become free.

The remaining coating 14 can now be removed, for example, by UV cleaning, so that the defect 13 that is covered by the field 15 remains (See FIG. 1E).

The method conditions for subsequent hardening depend on the organic compound that is deposited. The first time a raster is formed for the defect location, low effective bias voltages of 500 V to 1.5 kV must be used in the coating system in order to achieve dislocation of the energy (small depth penetration of the electron beam) close to the boundary surface, and thus secure fixing of the molecules. The strength of the trial current depends on the repair requirements and is typically between 1 nA and 10 pA, in order to achieve subsequent hardening which is highly controllable, but does not last for too long. Since the work is carried out using an electron microscope, it can be carried out at pressures of $10^{-6}$ torr.

FIG. 2 is a block diagram of an apparatus 30 for producing a phase shifter mask for 157 nm lithography. The apparatus 30 includes a device 20 for emitting an electron beam. Such an electron beam can be used to deposit the coating 14 of the organic material as discussed above in the description of the method. Additionally or alternatively, as described above in the description of the method, an electron beam emitted from the device 20 can scan the field 15 in rows and/or columns, which hardens the organic material in the coating 14.

The embodiment of the invention is not restricted to the preferred exemplary embodiments described above. In fact, a number of variants are feasible, which make use of the method according to the invention and of the apparatus according to the invention even for fundamentally different types of embodiments.

We claim:

1. A method for producing a phase shifter mask used for 157 nm lithography, the method which comprises:
    producing and processing a coating of an organic material on the phase shifter mask using an electron beam for repairing a defect of the phase shifter mask by the following steps:
    detecting a defect in a phase shifter material of the phase shifter mask;
    depositing a coating of a gaseous organic compound onto the phase shifter mask to thereby obtain the coating of the organic material on the phase shifter mask, the coating covering the defect over a wide area, the wide area exceeding the immediate region of the defect;
    pointing the electron beam at the coating of the organic material in the immediate region of the defect and scanning the immediate region with the electron beam, thereby decomposing the coating of the organic material such that the coating is hardened in the immediate region of the defect and a diffusion of organic compounds from non-irradiated areas of the coating of the organic compound to the immediate region of the defect is initiated; and
    removing the remaining coating outside the immediate region of the defect.

2. The method according to claim 1, wherein the coating of the organic material is configured on the phase shifter mask for repairing defects in a half-tone layer of the phase shifter mask.

3. The method according to claim 1, which comprises, after obtaining a decomposition product from the coating of the organic material, performing a UV cleaning of the phase shifter mask.

4. The method according to claim 1, wherein the organic compound is free of silicon-organic compounds.

5. The method according to claim 1, wherein the organic compound is an aromatic compound.

* * * * *